(12) United States Patent
Sijelmassi et al.

(10) Patent No.: US 11,975,400 B2
(45) Date of Patent: May 7, 2024

(54) RIBBON WIRE BOND

(71) Applicant: Texas Instruments Incorporated, Dallas, TX (US)

(72) Inventors: Amin Ahmad Sijelmassi, Dallas, TX (US); Bradley Glasscock, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/322,877

(22) Filed: May 17, 2021

(65) Prior Publication Data

US 2021/0268598 A1 Sep. 2, 2021

Related U.S. Application Data

(63) Continuation of application No. 15/926,312, filed on Mar. 20, 2018, now abandoned.

(51) Int. Cl.
  *H05K 1/02* (2006.01)
  *B23K 20/00* (2006.01)
  (Continued)

(52) U.S. Cl.
  CPC ............ *B23K 20/004* (2013.01); *H01L 24/45* (2013.01); *H01L 24/48* (2013.01); *H01L 24/78* (2013.01); *H01L 24/85* (2013.01); *H01L 2224/45014* (2013.01); *H01L 2924/014* (2013.01); *H01L 2924/14* (2013.01)

(58) Field of Classification Search
  CPC ... H05K 1/02; H05K 1/11; H05K 1/18; H05K 3/40; H05K 5/00; B23K 20/004; H01L 23/31; H01L 23/34; H01L 23/48; H01L 23/485; H01L 23/495; H01L 24/45; H01L 24/48; H01L 24/78; H01L 24/85
  USPC .......... 361/56, 540, 715, 749, 776; 257/678, 257/707, 737, 765; 174/261; 228/110.1
  See application file for complete search history.

(56) References Cited

U.S. PATENT DOCUMENTS 4,270,465 A * 6/1981 Lim ..................... H05K 3/1225
 101/127
4,311,267 A * 1/1982 Lim ....................... H01L 24/29
 228/248.1

(Continued)

FOREIGN PATENT DOCUMENTS

| WO | 1991010259 A1 | 7/1991 |
| WO | 2011005922 A1 | 1/2011 |
| WO | 2017171859 A1 | 10/2017 |

OTHER PUBLICATIONS

Patent Cooperation Treaty Search Report, PCT/US 2019/023235, dated Jun. 20, 2019, 2 pages.

*Primary Examiner* — Xiaoliang Chen
(74) *Attorney, Agent, or Firm* — Yudong Kim; Frank D. Cimino

(57) ABSTRACT

In a described example, an electrical apparatus includes a substrate having a first surface and lead pads on the first surface of the substrate for surface mounting components. A ribbon wire bond is provided having open ends and a central portion between the open ends, the open ends of the ribbon wire bond connected to the lead pads. An electrical component is bonded to the central portion of the ribbon wire bond. The central portion of the ribbon wire bond and the electrical component are spaced from the first surface of the substrate.

17 Claims, 10 Drawing Sheets

(51) Int. Cl.
*B23K 20/04* (2006.01)
*H01L 23/00* (2006.01)
*H01L 23/31* (2006.01)
*H01L 23/34* (2006.01)
*H01L 23/48* (2006.01)
*H01L 23/485* (2006.01)
*H01L 23/495* (2006.01)
*H05K 1/11* (2006.01)
*H05K 1/18* (2006.01)
*H05K 3/40* (2006.01)
*H05K 5/00* (2006.01)

(56) References Cited

U.S. PATENT DOCUMENTS

| | | | |
|---|---|---|---|
| 4,521,828 A * | 6/1985 | Fanning | H05K 1/18 |
| | | | 361/813 |
| 4,617,708 A * | 10/1986 | Fanning | H05K 9/00 |
| | | | 29/25.42 |
| 4,660,127 A * | 4/1987 | Gunter | H05K 3/3426 |
| | | | 29/25.03 |
| 5,136,122 A * | 8/1992 | Kwitkowski | H01R 12/52 |
| | | | 219/56.22 |
| 7,216,794 B2 | 5/2007 | Lange et al. | |
| 7,582,832 B2 | 9/2009 | Reinold et al. | |
| 2004/0150082 A1 * | 8/2004 | Kajiwara | H01L 23/49582 |
| | | | 257/E23.044 |
| 2004/0217488 A1 | 11/2004 | Luechinger | |
| 2004/0232545 A1 * | 11/2004 | Takaishi | H01L 23/49537 |
| | | | 257/E23.092 |
| 2007/0086129 A1 * | 4/2007 | Vos | H01L 27/0255 |
| | | | 361/56 |
| 2007/0207635 A1 | 9/2007 | Gailus et al. | |
| 2008/0142571 A1 | 6/2008 | Yokozuka et al. | |
| 2011/0037170 A1 * | 2/2011 | Shinohara | H01L 21/565 |
| | | | 257/737 |
| 2012/0061814 A1 | 3/2012 | Camacho et al. | |
| 2012/0282787 A1 * | 11/2012 | Stanke | H05K 3/3421 |
| | | | 439/65 |
| 2015/0366047 A1 * | 12/2015 | Okasaka | H05K 1/189 |
| | | | 174/254 |
| 2016/0029484 A1 * | 1/2016 | Kondo | H05K 1/111 |
| | | | 29/842 |
| 2016/0029487 A1 * | 1/2016 | Kondo | H01L 23/13 |
| | | | 29/842 |
| 2018/0153045 A1 * | 5/2018 | Kondo | H05K 5/0091 |

* cited by examiner

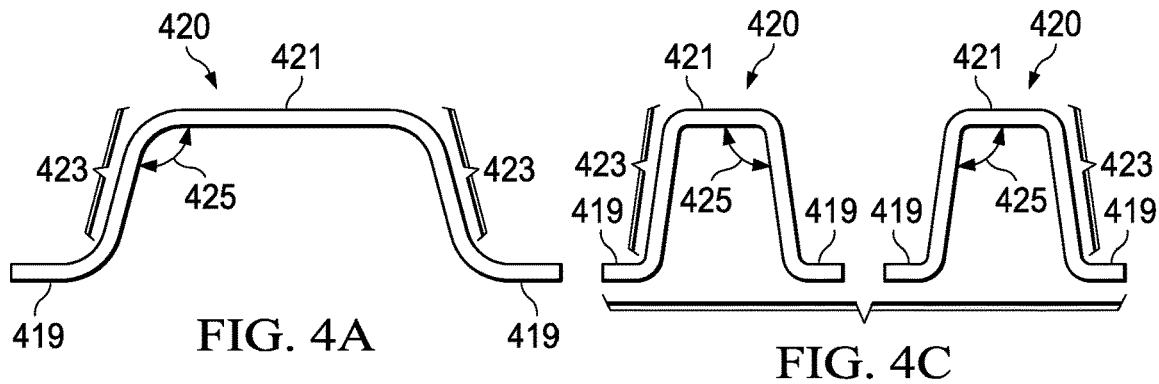
FIG. 4A
FIG. 4C
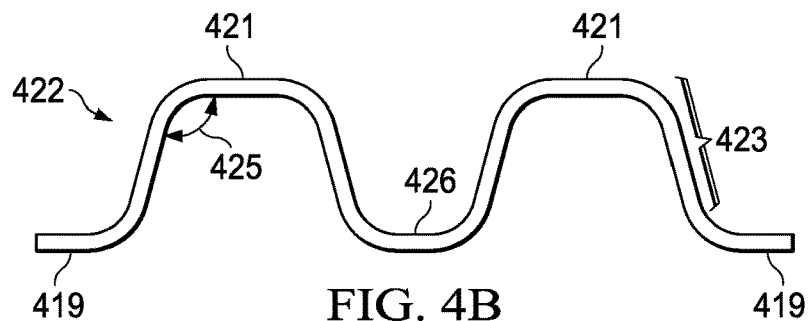
FIG. 4B
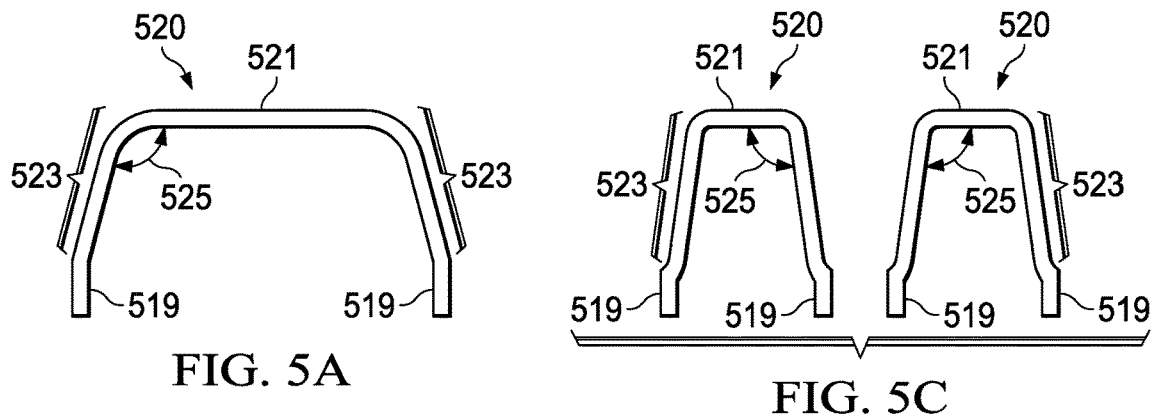
FIG. 5A
FIG. 5C
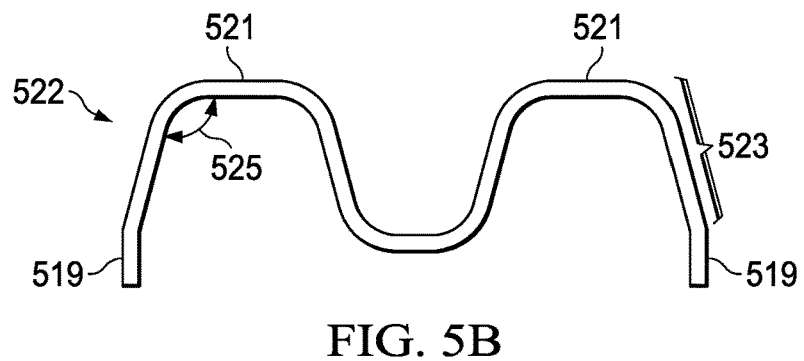
FIG. 5B

RIBBON WIRE BOND

This application is a continuation of U.S. patent application Ser. No. 15/926,312, filed Mar. 20, 2018, the contents of all of which are herein incorporated by reference in its entirety.

TECHNICAL FIELD

This disclosure relates generally to populating substrates with electrical components, and more particularly to a device and method for mounting devices to a substrate.

SUMMARY

In a described example, an electrical apparatus includes a substrate having a first surface and lead pads on the first surface of the substrate. A ribbon wire bond is provided having open ends and a central portion between the open ends, the open ends of the ribbon wire bond are connected to the lead pads. An electrical component is bonded to the central portion of the ribbon wire bond. The central portion of the ribbon wire bond and the electrical component are spaced from the first surface of the substrate.

BRIEF DESCRIPTION OF THE DRAWINGS

FIGS. 4A, 4B, and 4C are surface mount ribbon wire bonds.

FIGS. 5A, 5B, and 5C are through-hole ribbon wire bonds.

DETAILED DESCRIPTION

Figure 1:
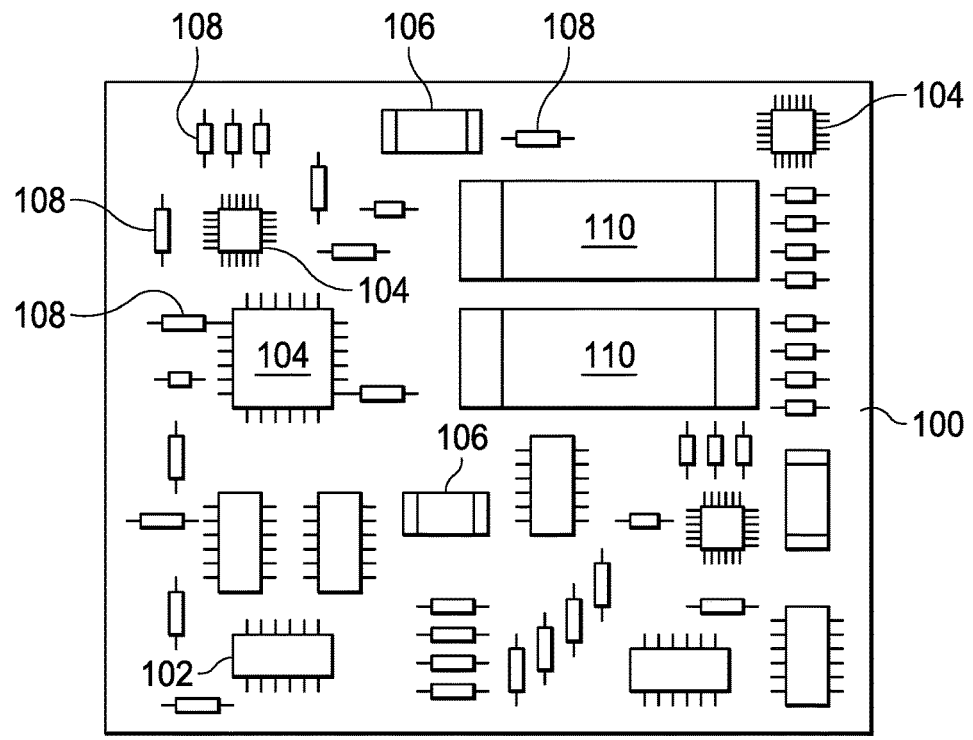
FIG. 1 is a top down view of a populated substrate.

Corresponding numerals and symbols in the different figures generally refer to corresponding parts, unless otherwise indicated. The figures are not necessarily drawn to scale. As is further described herein below, certain structures and surfaces are described as "parallel" to one another. For purposes of this disclosure, two elements are "parallel" when the elements are intended to lie in planes that, when extended, will not meet. However, the term parallel as used herein also includes surfaces that may slightly deviate in direction due to manufacturing tolerances. If the two surfaces generally lie in planes that are spaced apart and which would not intersect when extended infinitely if the surfaces were made without these deviations, these surfaces are also parallel.

As is further described hereinbelow, certain structures and surfaces are described as "perpendicular" to one another. For purposes of this disclosure, two elements are "perpendicular" when the elements are intended to form a 90-degree angle at their intersection. However, the term "perpendicular" as used herein also includes surfaces that may slightly deviate from 90 degrees due to manufacturing tolerances. Certain elements are described hereinbelow as "sub-PCBs." A sub-PCB is a printed circuit board that carries components and that has a surface area smaller than a PCB that the sub-PCB is mounted to.

Certain elements are described herein as "surface mount ribbon wire bonds." A surface mount ribbon wire bond has at least two open ends that are arranged to be soldered to a lead pad on a surface. The open ends have a portion that is parallel to the surface for mounting on the lead pad. The ribbon wire bonds have at least one central portion between the open ends. In some arrangements, the ribbon wire bonds have two or more central portions between the open ends. The central portions include a portion parallel to the surface and formed at an angle to legs that extend from a first open end, to the central portion, which extends to and forms the angle with another leg, and then the ribbon wire bond extends to the second open end. Thus the central portions continue the ribbon wire bond from a leg extending from an open end to form an approximately straight portion displaced from the surface. In some examples, additional portions of surface mount ribbon wire bonds may be arranged to be soldered to a pad on a surface.

Certain elements are described herein as "through-hole mount ribbon wire bonds." A through-hole mount ribbon wire bond is one that has at least open ends that are arranged perpendicular to a surface of a substrate, such as a printed circuit board (PCB). The through-hole ribbon wire bonds are mounted by insertion into an opening in a surface of the printed circuit board. Through-hole ribbon wire bonds as described herein may also have central portions that are parallel to the surface formed between the open ends.

In some described examples, the ribbon wire bonds shown are coupled to a surface of a PCB. In additional arrangements, the ribbon wire bonds can be coupled to a surface of a lead frame. In the described examples the ribbon wire bonds are shown with a component mounted thereon, with additional components mounted on the substrate. However alternative arrangements include a component mounted on a ribbon wire bond and spaced from a surface of a substrate without additional components. In an example a multi-chip module can be formed using ribbon wire bonds to mount components such as inductors, capacitors, resistors, transformers displaced from a surface of a lead frame, thereby reducing the surface area needed for components on the surface of the lead frame. The ribbon wire bonds can be mounted to any substrate, including a substrate where additional components would be mounted, and thereby reduce the area needed for the components on the surface of the substrate by displacing the components on the ribbon wire bond from the surface. PCBs and lead frames are examples of substrates, other examples include a premolded substrate for use in mounting components in a package, module, or system on a chip (SOC) or system in package (SiP or SIP) arrangement.

FIG. 1 is a depiction of a substrate such as a printed circuit board (PCB) populated with electrical components such as integrated circuits (IC), 102 and 104, capacitors 106, resistors 108, and inductors 110, transformers, and bulk acoustic wave devices (BAWs). The electrical components vary significantly in size. Electrical components such as inductors and transformers can be significantly bigger than capacitors, ICs and resistors. The bigger electrical components can occupy a disproportionately large portion of the PCB area. A "bigger" electrical device as used herein is one that has a surface area that is several times the surface area of other electrical devices on the circuit board such as capacitors, resistors or the like.

In an example arrangement, a bigger device is mounted on a central portion of a ribbon wire bond and is vertically displaced (as oriented in FIG. 1) from a surface of a substrate such as a PCB, while other devices can be mounted on the PCB beneath the bigger device. In an example, the bigger device is bonded to the central portion by soldering. Other mounting approaches such as welding or brazing could be used, so long as the component is physically attached and electrically contacting the ribbon wire bond. Conductive epoxy could also be used to mount the bigger devices to the ribbon wire bonds. The ribbon wire bonds can also be used for mounting smaller devices, resulting in smaller area requirements for the PCB, or for mounting a sub printed circuit board (sub-PCB). A sub-PCB is another PCB that itself carries devices of various sizes. In an example arrangement, the bigger device is a two terminal passive component such as an inductor, transformer, bulk acoustic wave device, or capacitor. In some applications two terminal passive components such as inductors, transformers and/or capacitors are needed that are bigger than other devices used in the application; in example arrangements these bigger devices can be mounted on a ribbon wire bond and displaced from the surface of the PCB while making it possible for additional devices of various sizes to be mounted on the PCB beneath the device mounted on the ribbon wire bond, thereby saving PCB area.

Figure 2:
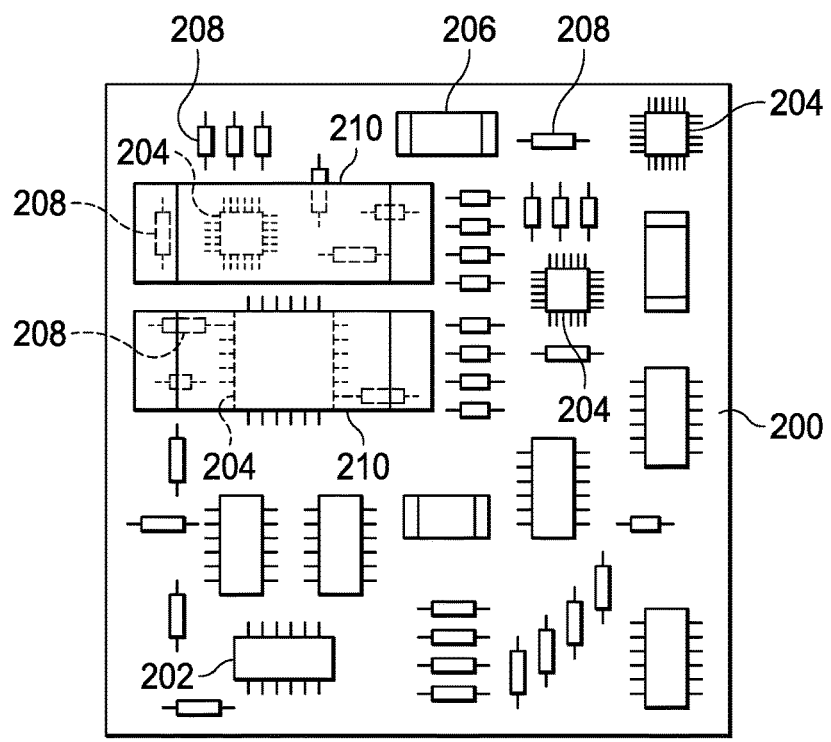
FIG. 2 is a top down view of a populated substrate with electrical components mounted above other components on the substrate.

In FIG. 2 similar reference labels are used for similar elements shown in FIG. 1, for clarity. For example, inductors 110 correspond to inductors 210 in FIG. 2. As described hereinabove, the ribbon wire bonds can also be used with substrates such as lead frames, PCBs, and molded substrates or premolded substrates. As shown in FIG. 2, by positioning larger electrical components such as inductors 210 overlying some of the smaller electrical components such as resistors 208 and ICs 204 on the PCB 200, the area of the PCB 200 (or other substrate) can be reduced.

Figure 3A:
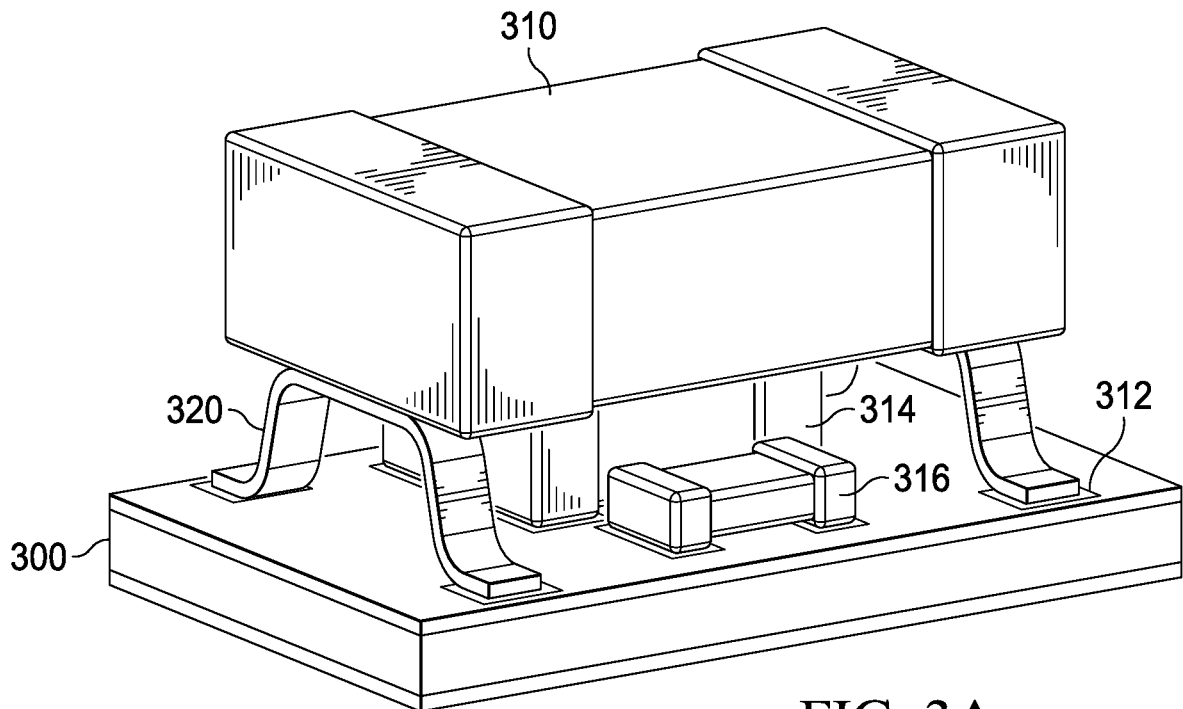
FIGS. 3A and 3B are a projection view and a side view of a substrate with an electrical component mounted above other electrical components on the substrate using ribbon wire bonds.
Figure 3B:
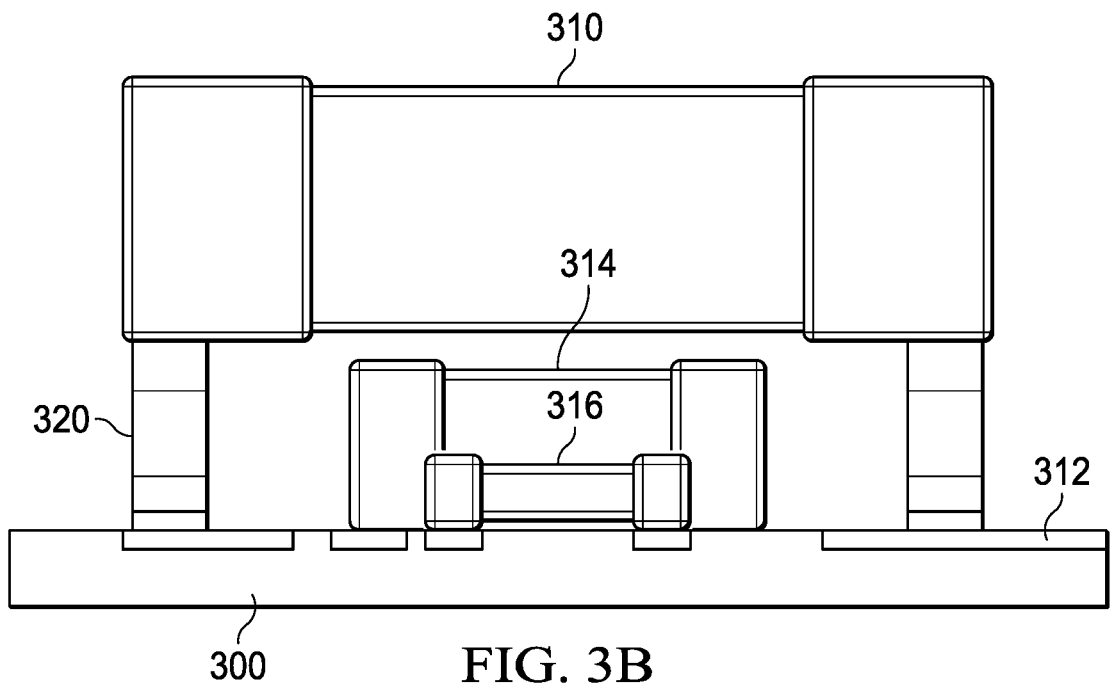

In FIGS. 3A and 3B similar reference labels are used for similar elements shown in FIG. 1, for clarity. For example, substrate 300 in FIGS. 3A and 3B corresponds to substrate 100 in FIG. 1. FIG. 3A is a projection view and FIG. 3B is a side view of a substrate 300 with an overlying component such as an inductor 310 is positioned above (as 300 is oriented in FIG. 3) and over underlying electrical components, such as smaller components 314 and 316 which are mounted on the surface of the substrate 300. The underlying electrical components, 314 and 316, can also be other electrical components such as resistors, capacitors, transistors, ICs, etc. Ribbon wire bonds 320 support the inductor 310 above components 314 and 316 on the substrate 300 (as the components and 300 are oriented in FIGS. 3A-3B) and provide electrical connection between the inductor 310 and lead pads 312 on the surface of substrate 300. By positioning the larger inductor 310 over underlying electrical components such as components 314 and 316 on the substrate 300, the area of the populated substrate 300 is reduced.

A few illustrative examples of ribbon wire bonds useful with the arrangements are shown in FIGS. 4A, 4B, 4C, and in FIGS. 5A, 5B, and 5C. Ribbon wire bonds with other shapes as needed can form alternative examples to accommodate other large electrical components. In FIGS. 4A and 5A similar reference labels are used for similar elements shown in FIG. 3A, for clarity. For example, ribbon wire bond 420 in FIG. 4A and ribbon wire bond 520 in 5A correspond to ribbon wire bond 320 in FIG. 3A.

Ribbon wire bonds 420 and 422 illustrated in FIGS. 4A, 4B, and 4C are arranged to be soldered to the surface of leads on a substrate, that is, the ribbon wire bond ends are to be surface mounted on the substrate. The surface mount ribbon wire bonds can be U-shaped such as ribbon wire bond 420 as shown in FIG. 4A or W-shaped such as ribbon wire bond 422 as shown in FIG. 4B. The sizes and shapes can be varied as shown in FIG. 4C, where two U-shaped ribbon wire bonds 420 that are smaller (compared to those in FIGS. 4A, 4B) and that have steeper angles between the legs and a central portion in the U-shape than that in FIG. 4A are shown. The U-shaped ribbon wire bond 420 has a central portion 421 in the middle portion of the U (uppermost and central portion as oriented in FIGS. 4A and 4C) to which the electrical component can be attached. A layer of solderability material such as a plating of nickel, nickel palladium, nickel gold, or other solderable metals and alloys (not shown) can be placed on the central portion 421. The open ends 419 of the legs 423 of the U are bent outwards (the two open ends 419 of the ribbon wire bond 420 in FIG. 4A) until they are approximately parallel with the central portion 421 of the U. The legs 423 form an angle 425 with the central portion 421. The angle can vary but is greater than or equal to ninety degrees or perpendicular, and can be from about one hundred ten to one hundred thirty five degrees, for example. The open ends 419 are designed to lie on and to be soldered to lead pads (see lead pads 612 in FIG. 6G) on the surface of a substrate such as PCB 600. The U-shaped surface mount ribbon wire bond 620 is inverted when mounted on the PCB 600 and the open ends are soldered to lead pads 612. A component (see 610 FIG. 6G) is then mounted on the central portion 421 of the U-shaped ribbon wire bond 420.

The points on the "W" of the W-shaped ribbon wire bond 422 in FIG. 4B are flattened to provide central portions 421 to which overlying electrical components can be attached. The central portions 421 are shown approximately parallel to the open ends 419 but need not be exactly so. Legs 423 form an angle 425 with the central portion 421 of 422, as described hereinabove. The open ends 419 of the legs 423 of the W-shaped ribbon wire bonds 422 are bent outwards from the W until they are approximately parallel with the flattened central portions 421 of the W. These open ends 419 are designed to lie on and be soldered to lead pads (see lead pads 612 in FIG. 6G) on the PCB 600. Also in FIG. 4B a portion of the W shaped ribbon wire bond 422 (the centermost portion 426 of 422 as oriented in FIG. 4B) is generally straight and parallel to the open ends 419 of the legs and is also arranged to be soldered to a lead pad on a substrate to form an additional support (see the lead pad 612 on PCB 600 in FIG. 6G).

U-shaped ribbon wire bonds 420 and W-shaped ribbon wire bond 422 are surface mount ribbon wire bonds as illustrated in FIGS. 4A and 4B. Other ribbon wire bond shapes with more than one or two flattened areas for attachment of overlying electrical components can be designed as needed to accommodate other electrical components.

FIGS. 5A-5C illustrate example through-hole ribbon wire bonds. The through-hole U-shaped ribbon wire bond 520 in FIGS. 5A and 5C, and the through-hole W-shaped ribbon wire bond 522 in FIG. 5B are designed for through-hole mounting in substrates (such as PCB 900 in FIG. 9B). The open ends 519 of the legs of through-hole U-shaped ribbon wire bond 520 and the open ends 519 of the legs of the through-hole W-shaped ribbon wire bond 522 are bent to be approximately perpendicular to a first surface of the substrate (see 900 FIG. 9B) the ribbon wire bond is to be mounted on. The open ends 519 of these through-hole ribbon wire bonds 520 and 522 are designed to be inserted through holes in the PCB 900 at lead pads 912 and soldered. The through-hole U-shaped ribbon wire bond, 520, is inverted and the open ends 519 are inserted through holes in lead pads 912 on PCB 900 and soldered. The leg portions 523 extend from the open ends 519 to the central portions, 521, and an angle 525 is formed at the intersection of the leg portion 523 and the central portion 521. An electrical component (not shown in FIGS. 5A-5C, see the sub-PCB 950 in FIG. 9B) is then mounted on the central portion 521 of the of the through-hole U-shaped ribbon wire bond 520.

Figure 6A:
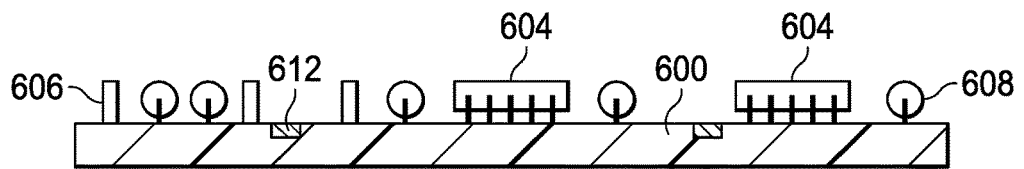
FIGS. 6A through 6G are cross sections illustrating the steps for mounting an electrical component above a substrate using ribbon wire bonds.
Figure 6B:
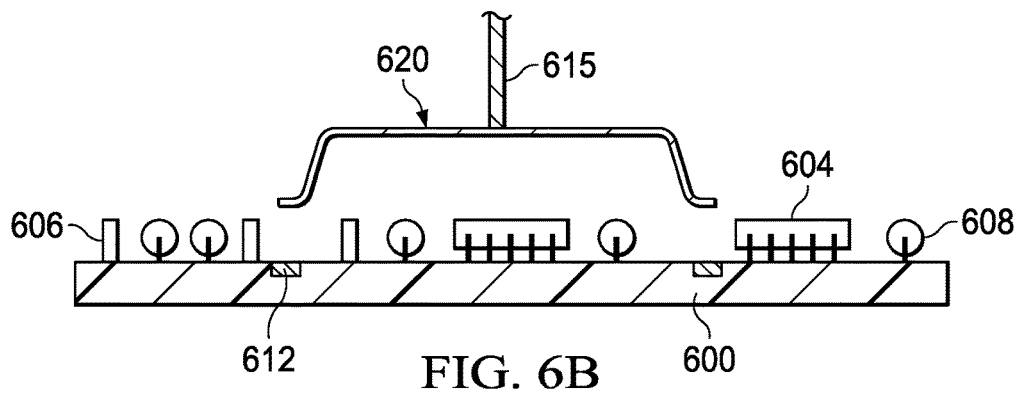
Figure 6C:
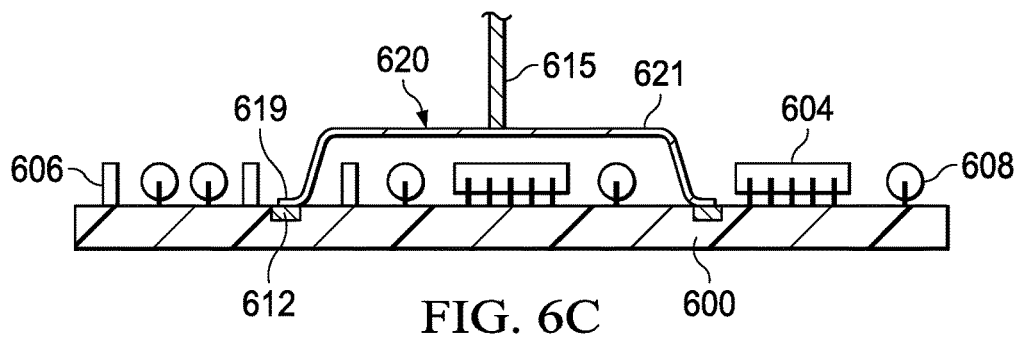
Figure 6D:
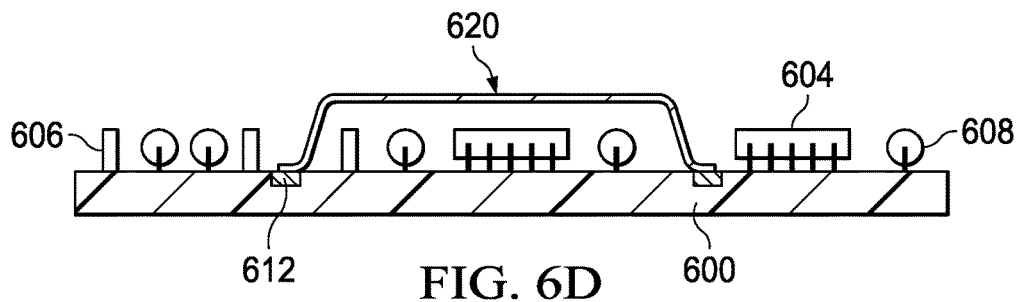
Figure 6E:
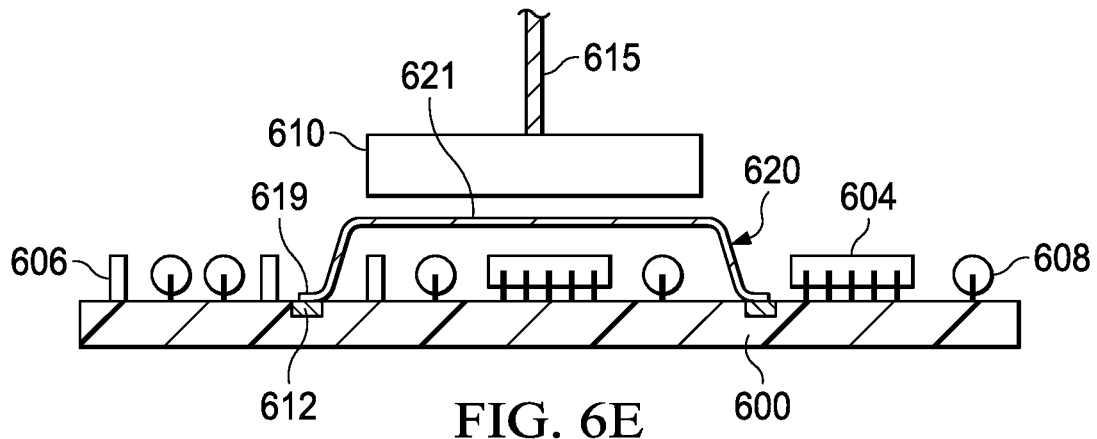
Figure 6F:
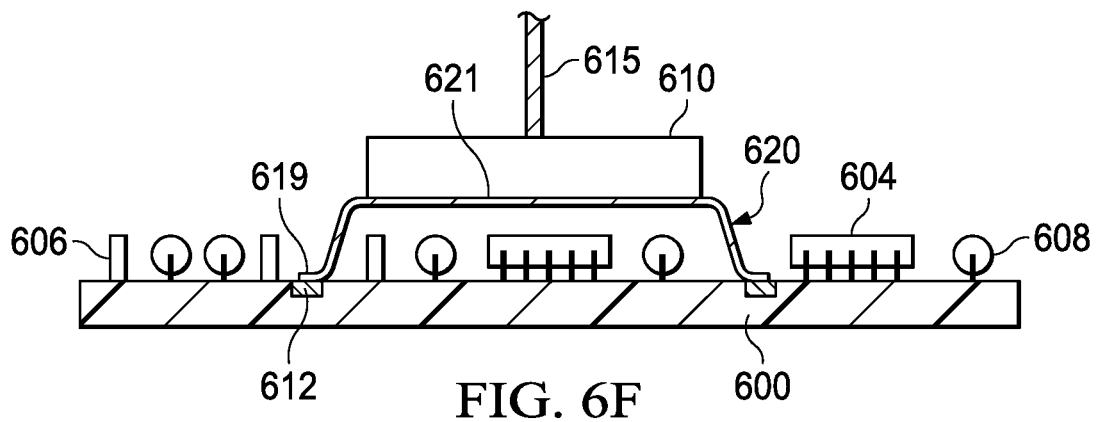
Figure 6G:
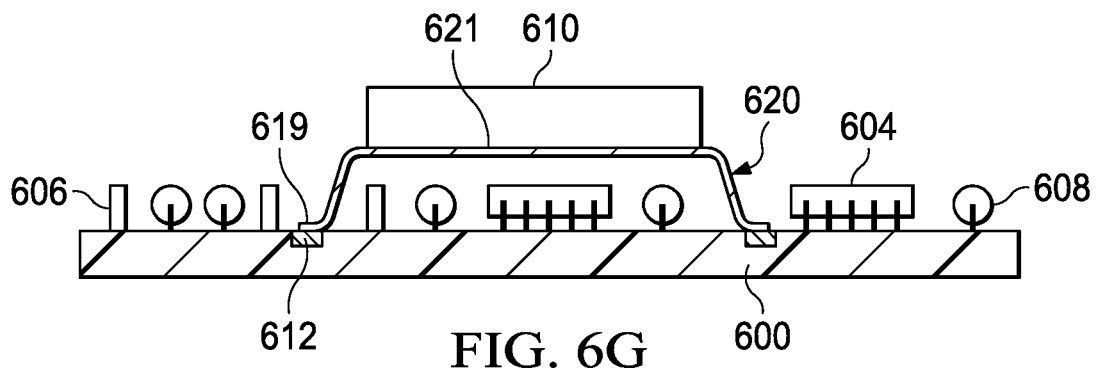
Figure 7:
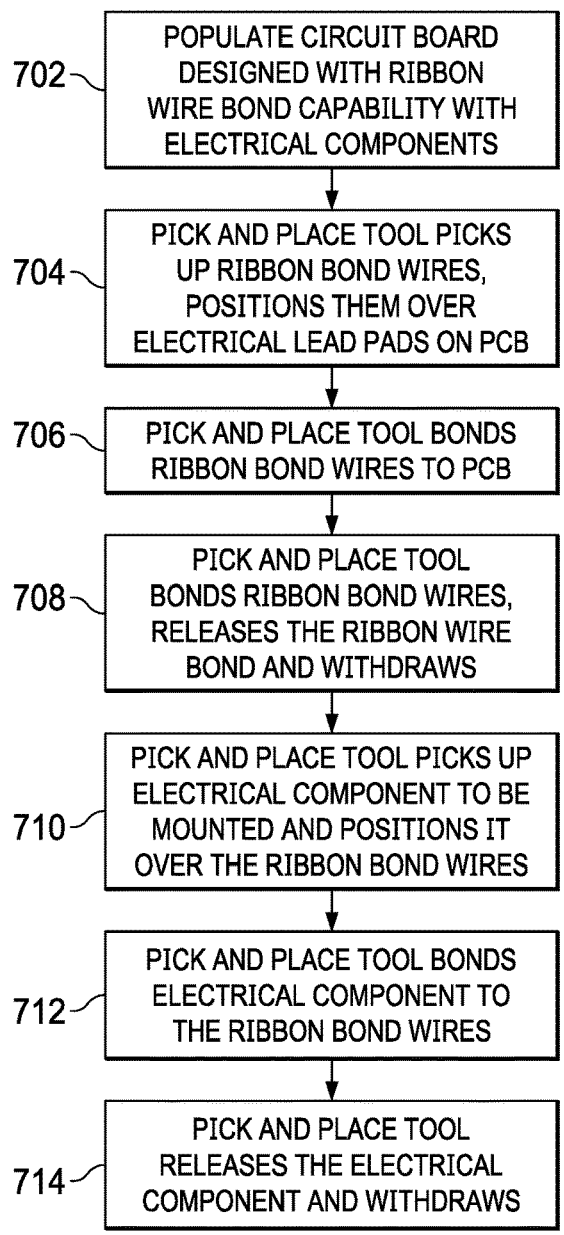
FIG. 7 is a flow diagram listing the steps for mounting an electrical component above a substrate using ribbon wire bonds.

A method for mounting electrical components spaced from a substrate surface and over underlying electrical components on a substrate (such as a lead frame or a PCB) using ribbon wire bonds is described in the flow chart in FIG. 7, and the method results are shown in FIGS. 6A through 6E. In FIGS. 6A through 6G similar reference labels are used for similar elements shown in FIGS. 3A and 3B, for clarity. For example, substrate 600 in FIGS. 6A through 6G corresponds to substrate 300 in FIGS. 3A and 3B.

FIG. 6A shows a substrate 600 that is ribbon wire bond compatible. In this example the substrate is shown populated with electrical components such as ICs 604, capacitors 606, resistors 608, etc. (see step 702 in FIG. 7). In an alternative the substrate 600 may be free of additional components.

In FIG. 6B a pick and place tool 615 picks up a ribbon wire bond 620 and positions it above lead pads 612 on the substrate 600 (step 704).

In FIG. 6C the pick and place tool bonds the open ends 619 of the ribbon wire bond 620 to lead pads 612 on the substrate 600 (step 706).

In FIG. 6D the pick and place tool releases the ribbon wire bond 620 and withdraws (step 708).

In FIG. 6E the pick and place tool picks up the electrical component 610 to be mounted on the ribbon wire bond 620 and positions it above the ribbon wire bond 620 that is mounted on the lead pads 612 on the substrate 600 (step 710).

In FIG. 6F the pick and place tool 615 bonds the electrical component 610 to the central portion 621 of the ribbon wire bond 620 (step 712)

In FIG. 6G the pick and place tool 615 releases the electrical component 610 and withdraws (step 714).

Figure 8A:
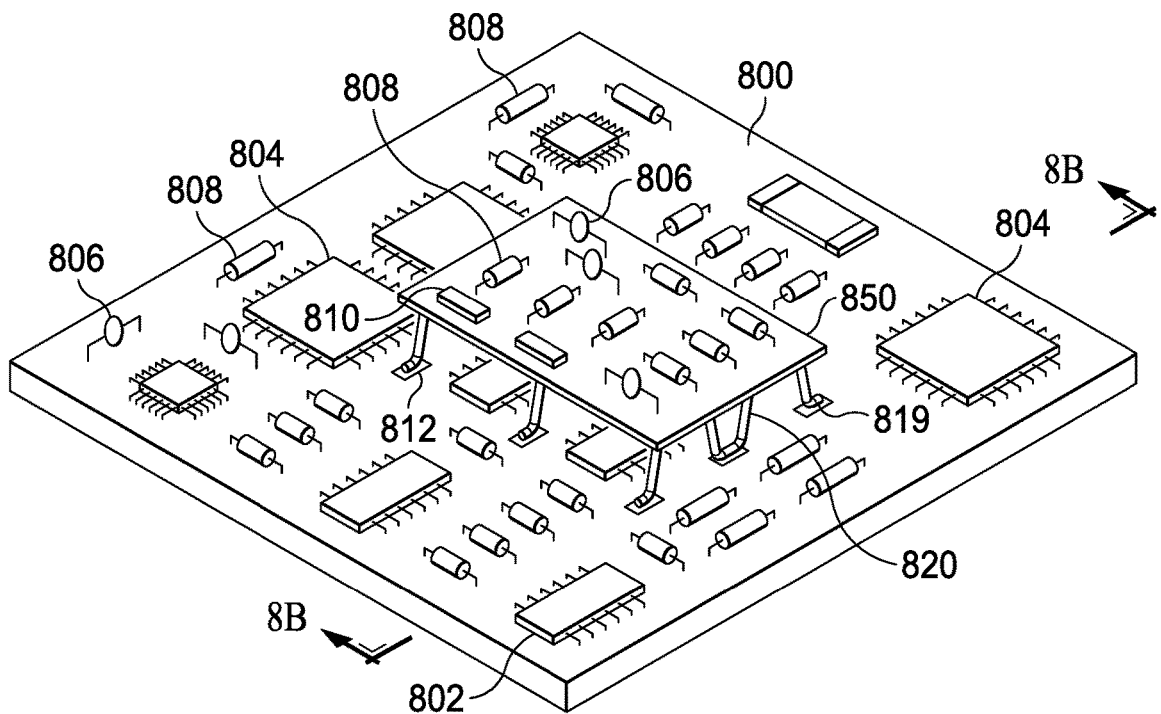
FIGS. 8A and 8B are a projection view and cross section view of a sub-PCB mounted above a PCB using surface mount ribbon wire bonds.
Figure 8B:
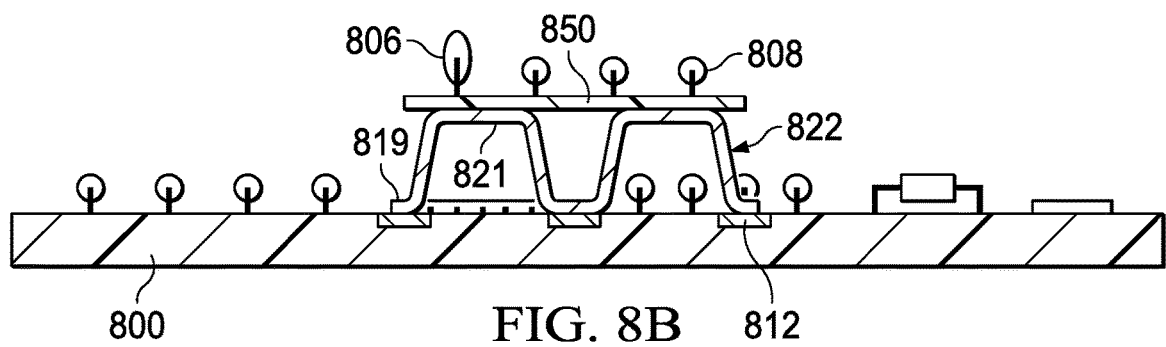

In FIGS. 8A and 8B similar reference labels are used for similar elements shown in FIGS. 3A and 3B, for clarity. FIGS. 8A and 8B illustrate how surface mount ribbon wire bonds 820 (partially visible in FIG. 8A) can reduce the area of a PCB 800 by mounting a sub-PCB 850 with electrical components above other electrical components on the PCB 800. PCB 800 has multiple electrical components such as ICs 802 and 804, capacitors 806, and resistors 808 soldered to leads on the surface of the PCB 800.

As illustrated in FIGS. 8A and 8B, a sub-PCB 850 with electrical components such as inductors 810, resistors 808, capacitors 806, etc. is formed and then mounted on surface mount ribbon wire bonds 820 spaced from the surface of the PCB 800. As shown in FIG. 8A, multiple surface mount ribbon wire bonds 820 can be used to provide multiple independent electrical contacts from the sub-PCB 850 to the underlying PCB 800. Open ends 819 of the surface mount ribbon wire bonds 820 are approximately parallel to the surface of the PCB 800 and are bonded, (for example soldered) to lead pads 812 on the surface of the PCB 800. The sub-PCB 850 is then bonded to (for example, soldered, brazed, epoxied or welded) to the central portions 821 of surface mount ribbon wire bonds 820 and 822 above the PCB 800. The central portions 821 are approximately parallel to the surface of the PCB 800 but need not be exactly parallel. The surface mount ribbon wire bonds 820 and 822 support the sub-PCB 850 above the PCB 800 and provide electrical connection between lead pads 812 on the surface of the PCB 800 and the electrical components on the sub-PCB 850. The sub-PCB 850 enables a smaller PCB 800 to be used.

Figure 9A:
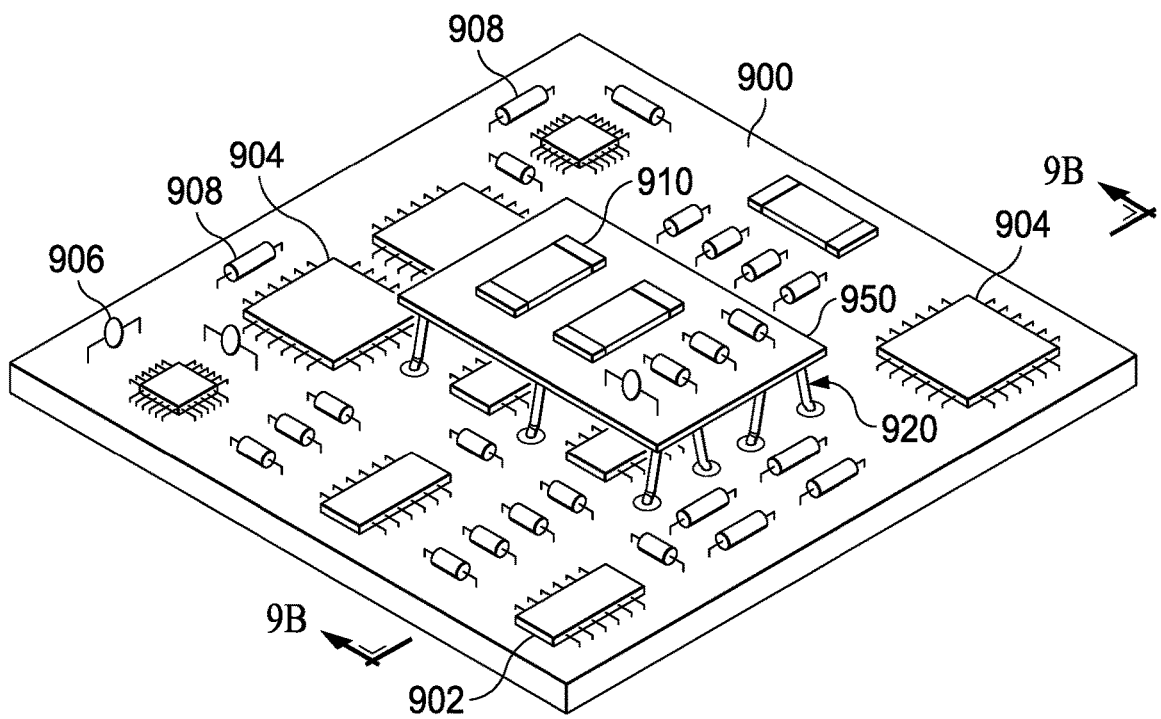
FIGS. 9A and 9B are a projection view and cross section view of a sub-PCB mounted above a PCB using through-hole ribbon wire bonds.
Figure 9B:
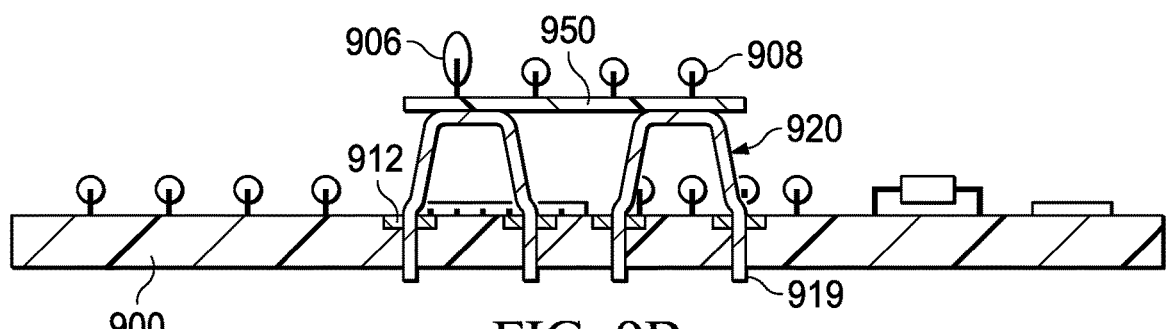

FIGS. 9A and 9B illustrate a sub-PCB 950 mounted above a PCB 900 using through-hole ribbon wire bonds 920. In FIGS. 9A and 9B similar reference labels are used for similar elements shown in FIGS. 3A and 3B, for clarity.

Open ends of the through-hole ribbon wire bonds 920 that are arranged approximately perpendicular to the surface of the PCB 900 are inserted in through-holes in the PCB 900, and are soldered. The sub-PCB 950 is then bonded to the central portion of the through-hole ribbon wire bonds 920 above (as PCB 900 is oriented in FIG. 9) the PCB 900.

Figure 10:
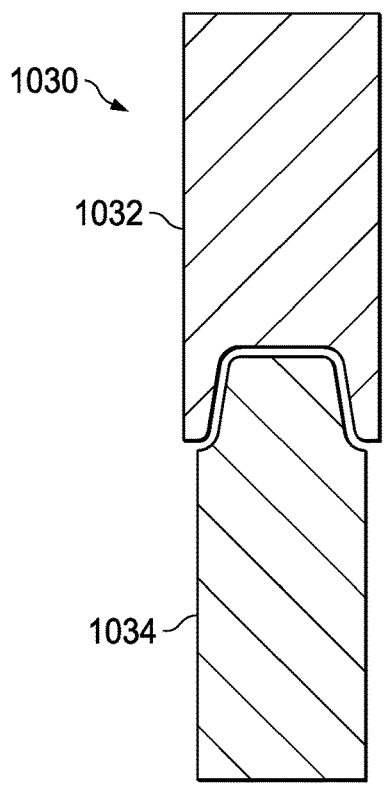
FIG. 10 is a cross-sectional view of a stamping die for forming a surface mount ribbon wire bond.

In FIGS. 11, 12, 13, and 14 similar reference labels are used for similar elements shown in FIG. 10, for clarity. For example, stamping die 1130 in FIG. 11, 1230 in FIG. 12, 1330 in FIG. 13, and 1430 in FIG. 14 correspond to stamping die 1030 in FIG. 10.

Figure 11:
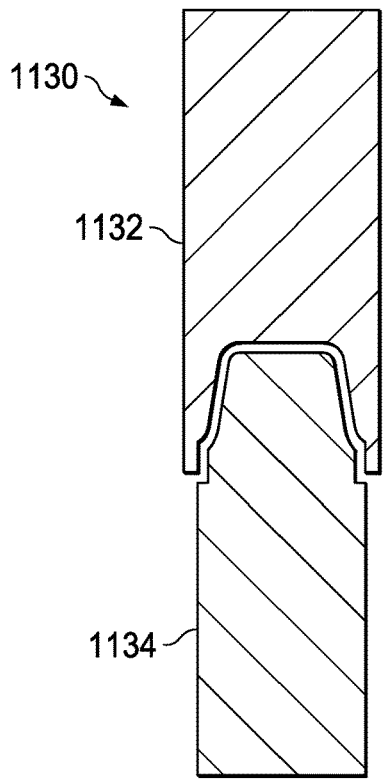
FIG. 11 is a cross-sectional view of a stamping die for forming a through-hole mount ribbon wire bond.

The ribbon wire bonds can be formed using a stamping die 1030 such as is illustrated in FIGS. 10 and 11. A surface mount ribbon wire bond (examples shown in FIGS. 4A and 4B) is formed using the stamping die 1030 shown in FIG. 10. Wire is placed between the first half 1032 and second half 1034 of the stamping die 1030 when the stamping die 1030 is open. The wire can be from 0.5 to 5 mils (thousandths of an inch) in diameter. Bond wire used in semiconductor wire bonding can be used. As the stamping die 1030 is closed it bends the wire into the desired shape. The stamping die 1030 can be modified to produce many different desired ribbon wire bond shapes.

Similarly, a through-hole ribbon wire bond (examples shown in FIGS. 5A and 5B) can be formed using the stamping die 1130 illustrated in FIG. 11.

Figure 12:
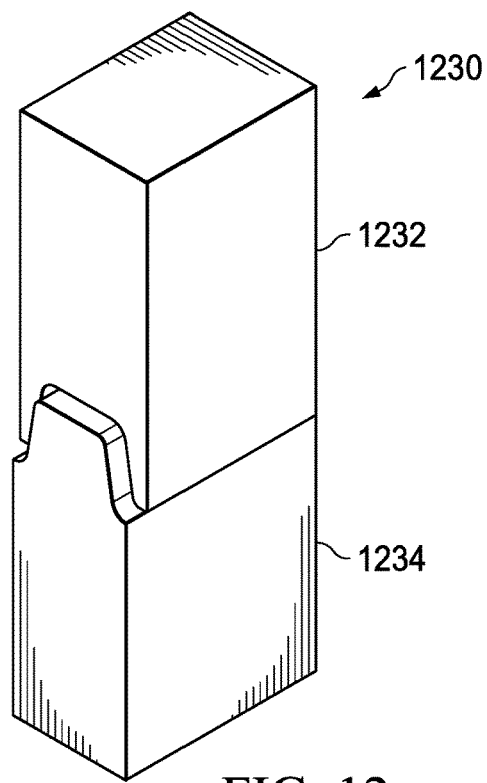
FIG. 12 is a projection view of a stamping die for forming individual ribbon wire bonds.

A stamping die 1230 for producing one ribbon wire bond with each stamping operation is illustrated in FIG. 12.

Figure 13:
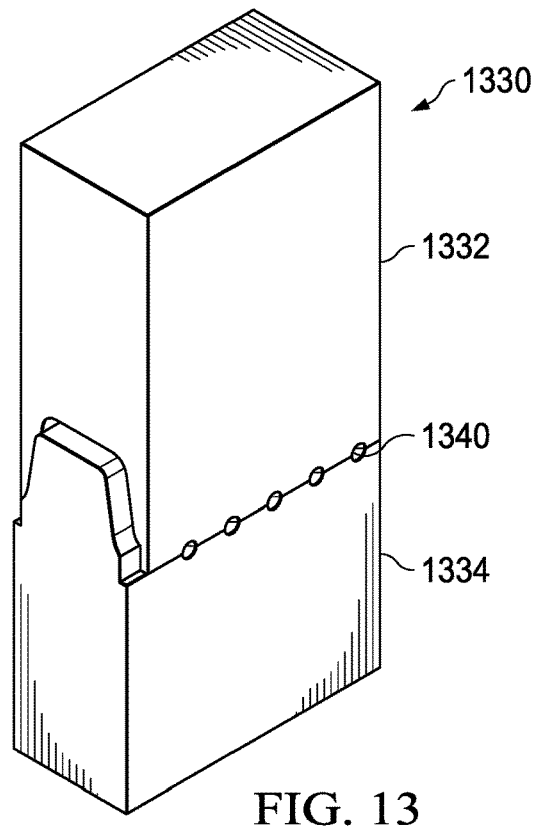
FIG. 13 is a projection view of a stamping die for forming multiple ribbon wire bonds.

A stamping die 1330 for producing multiple ribbon wire bonds during each stamping operation is illustrated in FIG. 13. Illustrated in FIG. 13, five wires can be placed in the open stamping die 1330 and five ribbon wire bonds can be placed in the wire channels 1340, and five ribbon wire bonds can be formed at the same time when the first half 1332 and second half 1334 of the stamping die are closed. In alternative arrangements, more or fewer ribbon wire bonds can be formed by using more or fewer wire channels in the stamping die.

Figure 15:
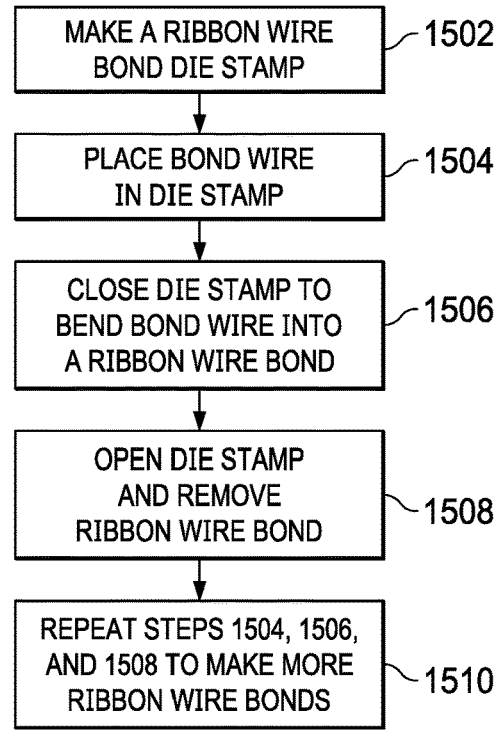
FIG. 15 is a flow diagram for a method for forming ribbon wire bonds.

FIGS. 14A through 14D and the flow diagram in FIG. 15 illustrate in more detail a method for forming ribbon wire bonds.

In the first step 1502 of FIG. 15 a stamping die 1430 designed to stamp out a ribbon wire bond 1420 (FIG. 14C) with the desired shape is made.

Figure 14A:
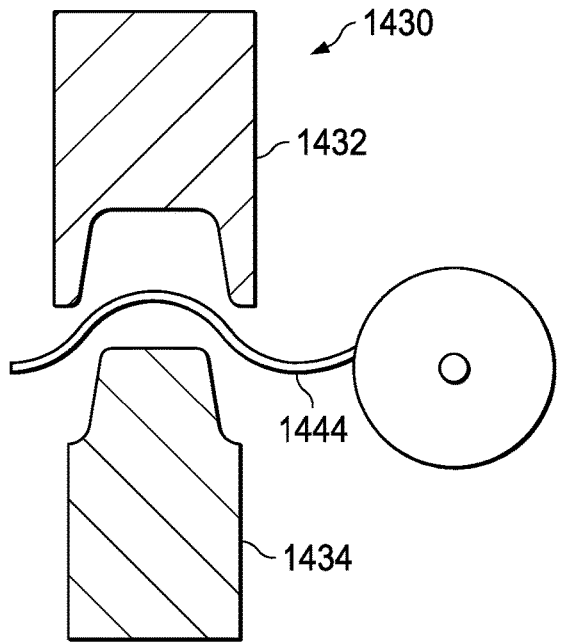
FIGS. 14A through 14D are cross sections illustrating the steps in forming ribbon wire bonds.

In step 1504 and illustrated in FIG. 14A, a wire 1444 is placed in the opening between the first half 1432 and second half 1434 of the opened stamping die 1430.

Figure 14B:
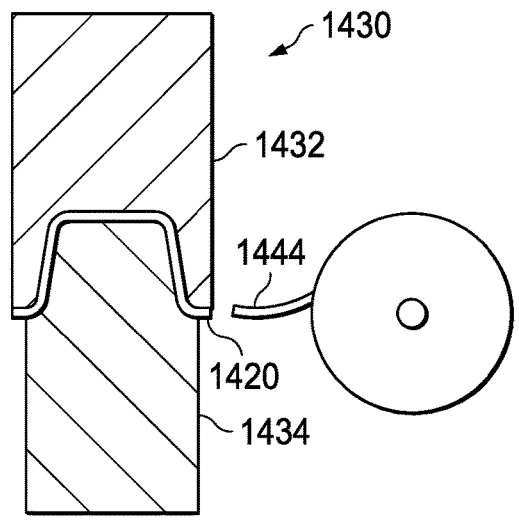

In step 1506 and illustrated in FIG. 14B, the stamping die 1430 is closed. As the stamping die 1430 closes the first half 1432 and second half 1434 of the stamping die 1430 bend the wire 1444 into the desired shape of the ribbon wire bond 1420 and cut it free from the wire 1444.

Figure 14C:
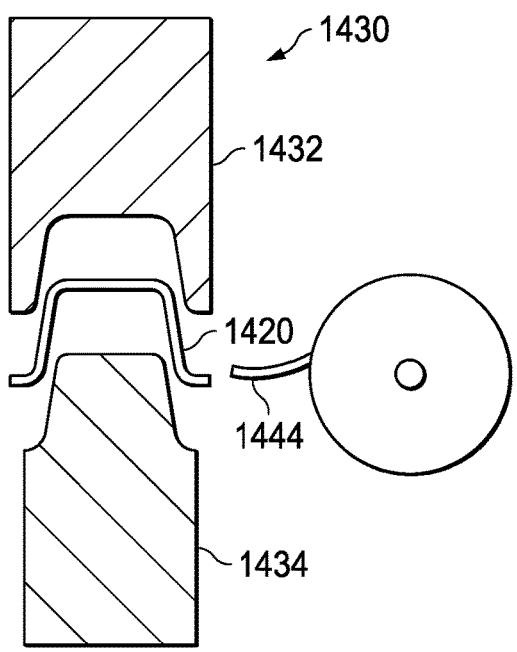
Figure 14D:
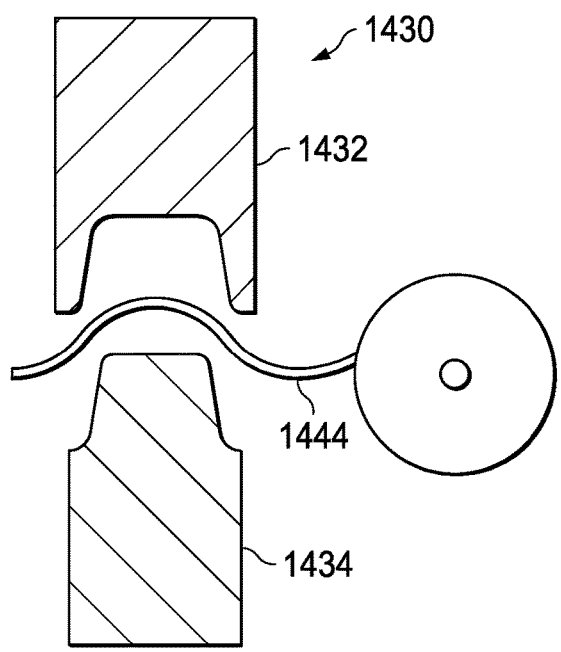

In step 1508 and illustrated in FIG. 14C, the stamping die 1430 is opened and a completed ribbon wire bond 1420 is removed. This completes the manufacture of one ribbon wire bond 1420.

After step 1508 is completed, the path 1510 illustrates the steps 1504, 1506, 1508 can be repeated to manufacture multiple ribbon wire bonds.

The ribbon wire bonds can also be supplied as premade structures. The ribbon wire bonds may be temporarily mounted on an adhesive tape or film and supplied as a spool or reel to a pick and place tool for use with assembly methods as described in FIGS. 6A-6G hereinabove. Alternatively the ribbon wire bonds can be supplied individually for use with pick and place tools.

Modifications are possible in the described arrangements, and other alternative arrangements are possible within the scope of the claims.

What is claimed is:

1. A method for making an electrical apparatus, comprising:
    mounting a first electrical component on a surface of a substrate;
    soldering open ends of a ribbon wire bond to lead pads on the surface of the substrate, wherein:
        the ribbon wire bond includes a U-shape or a W-shape, the ribbon wire bond having a central portion between the open ends, and the central portion having a first side facing away from the open ends and a second side opposite the first side; and
        the ribbon wire bond extends over the first electrical component with open space between the ribbon wire bond and the first electrical component; and
    mounting a second electrical component to the first side of the central portion of the ribbon wire bond.

2. The method of claim 1, wherein the ribbon wire bond is a U-shaped ribbon wire bond with the open ends of the U-shaped ribbon wire bond bent parallel to the lead pads.

3. The method of claim 1, wherein the ribbon wire bond is a U-shaped ribbon wire bond with the open ends of the U-shaped ribbon wire bond bent perpendicular to the surface of the substrate.

4. The method of claim 1, wherein the ribbon wire bond is a W-shaped ribbon wire bond with the open ends of the W-shaped ribbon wire bond bent parallel to the lead pads.

5. The method of claim 1, wherein the ribbon wire bond is a W-shaped ribbon wire bond with the open ends of the W-shaped ribbon wire bond bent perpendicular to the surface of the substrate.

6. The method of claim 1, wherein mounting the second electrical component further comprises soldering a terminal of the electrical component to the central portion of the ribbon wire bond.

7. The method of claim 1, wherein soldering the open ends of the ribbon wire bond includes surface mounting the open ends to the lead pads, the open ends bent parallel to the lead pads.

8. The method of claim 1, wherein soldering the open ends of the ribbon wire bond includes inserting the open ends to through holes of the lead pads, the open ends bent perpendicular to the surface of the substrate.

9. The method of claim 1, wherein the electrical component includes an integrated circuit, a capacitor, a resistor, an inductor, a transformer, or a bulk acoustic wave device (BAW).

10. The method of claim 1, wherein the electrical component corresponds to a sub-PCB (printed circuit board) including integrated circuits, capacitors, resistors, inductors, transformers, bulk acoustic wave devices (BAWs), or any combination thereof.

11. A method for making an electrical apparatus, comprising:
    soldering open ends of a ribbon wire bond to lead pads on a surface of a substrate, wherein:
        the ribbon wire bond includes a W-shape, the ribbon wire bond having a central portion between the open ends, and the central portion having a first side facing away from the open ends and a second side opposite the first side;
        the open ends are bent parallel to the lead pads or bent perpendicular to the surface of the substrate; and
        the central portion extends over the substrate with open space between the second side of the central portion and the surface of the substrate; and
    mounting an electrical component to the first side of the central portion of the ribbon wire bond.

12. The method of claim 11, wherein mounting the electrical component further comprises soldering a terminal of the electrical component to the central portion of the ribbon wire bond.

13. The method of claim 11, wherein soldering the open ends of the ribbon wire bond includes surface mounting the open ends to the lead pads.

14. The method of claim 11, wherein soldering the open ends of the ribbon wire bond includes inserting the open ends to through holes of the lead pads.

15. The method of claim 11, wherein:
    the electrical component is a first electrical component; and
    one or more second electrical components occupy part of the open space.

16. The method of claim 11, wherein the electrical component includes an integrated circuit, a capacitor, a resistor, an inductor, a transformer, or a bulk acoustic wave device (BAW).

17. The method of claim 11, wherein the electrical component corresponds to a sub-PCB (printed circuit board) including integrated circuits, capacitors, resistors, inductors, transformers, bulk acoustic wave devices (BAWs), or any combination thereof.

* * * * *